United States Patent [19]

Soubeyrand

[11] Patent Number: 5,798,142
[45] Date of Patent: Aug. 25, 1998

[54] CVD METHOD OF DEPOSITING A SILICA COATING ON A HEATED GLASS SUBSTRATE

[75] Inventor: Michel J. Soubeyrand, Holland, Ohio

[73] Assignee: Libbey-Owens-Ford Co., Toledo, Ohio

[21] Appl. No.: 681,611

[22] Filed: Jul. 29, 1996

Related U.S. Application Data

[63] Continuation of Ser. No. 323,272, Oct. 14, 1994, abandoned.

[51] Int. Cl.$^6$ .................................................. C23C 16/40
[52] U.S. Cl. .................. 427/255; 427/255.1; 427/255.2; 427/255.3; 427/314; 427/109; 427/167; 65/60.8
[58] Field of Search ................................ 427/109, 167, 427/255, 255.1, 255.2, 255.3, 314; 65/60.8, 60.5

[56] References Cited

U.S. PATENT DOCUMENTS

| | | |
|---|---|---|
| 4,019,877 | 4/1977 | Gass et al. . |
| 4,188,444 | 2/1980 | Landau . |
| 4,661,381 | 4/1987 | Callies et al. ........................ 427/255 |
| 4,946,712 | 8/1990 | Goodman et al. ..................... 427/166 |
| 4,995,893 | 2/1991 | Jenkins et al. . |
| 5,089,039 | 2/1992 | Terneu et al. . |
| 5,165,972 | 11/1992 | Porter . |
| 5,203,903 | 4/1993 | Terneu et al. . |
| 5,217,753 | 6/1993 | Goodman et al. ..................... 427/166 |
| 5,221,352 | 6/1993 | Terneu et al. . |
| 5,304,394 | 4/1994 | Sauvinet et al. . |

OTHER PUBLICATIONS

Takahashi et al, Appl. Phys. lett. 66 (21) May 1995, pp. 2858–2860.
Koda et al, Combust. Flame, 73, 187 (1988).
The Oxidation of Silicon Hydrides, H.J. Emeleus and K. Stewart, 1935, pp. 1182–1189 No other publication information is available.

*Primary Examiner*—Roy V. King
*Attorney, Agent, or Firm*—Marshall & Melhorn

[57] ABSTRACT

A method of pyrolytically forming a silica-containing coating on a glass substrate at an elevated temperature. Silane, oxygen, a radical scavenger gas and a carrier gas are combined as a precursor mixture, and the precursor is directed toward and along the surface of the heated glass substrate. The presence of the radical scavenger allows the silane, which is pyrophoric, to be premixed with the oxygen without undergoing ignition and premature reaction at the operating temperatures. The radical scavenger further provides control of and permits optimization of the kinetics of the chemical vapor deposition (CVD) reaction on the glass. A preferred combination of precursor materials includes monosilane and oxygen, with ethylene as the radical scavenger, and including nitrogen as a carrier gas.

21 Claims, 2 Drawing Sheets

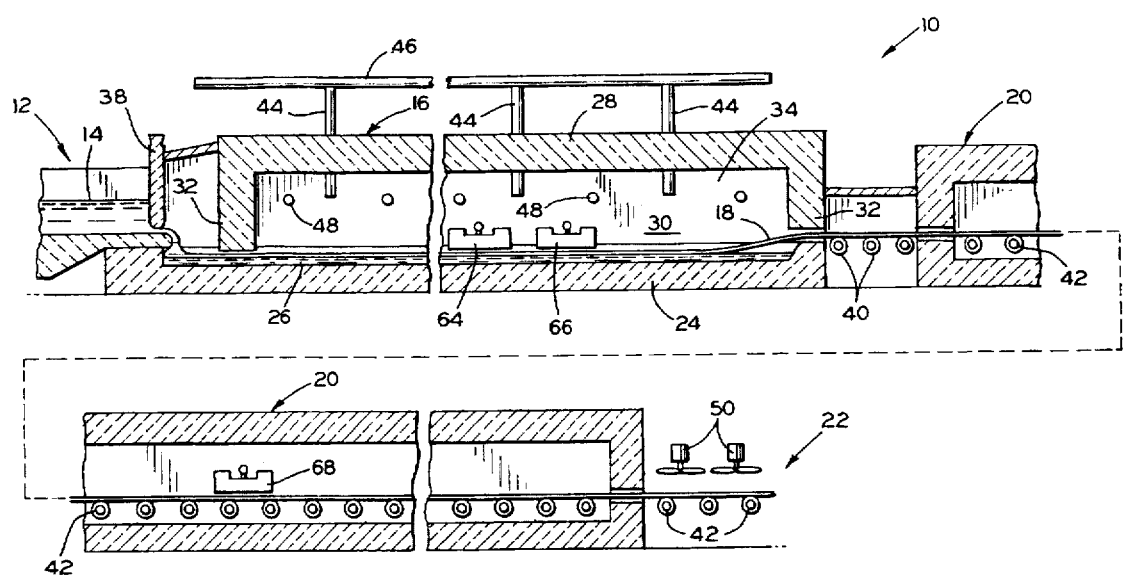
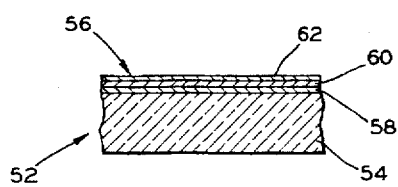
FIG. 1
FIG. 2

CVD METHOD OF DEPOSITING A SILICA COATING ON A HEATED GLASS SUBSTRATE

This application is a continuation of application Ser. No. 08/323,272, filed Oct. 14, 1994, now abandoned, which is incorporated by reference herein.

BACKGROUND OF THE INVENTION

1. Field of the Invention

The present invention pertains to a process for applying a coating to glass, and more particularly to a continuous chemical vapor deposition process, commonly known as a CVD process, for application of a silica coating to a glass substrate.

2. Description of the Prior Art

Silica coatings are commonly applied to glass substrates alone or in combination with various other coatings for modifying characteristics of the glass for use in vehicles and for architectural purposes. Typically, such coated glass is produced by continuously coating a glass substrate during its manufacture by a process known as the float glass process. In accordance with this process, molten glass is deposited on an enclosed elongated bath of molten tin over which a non-oxidizing atmosphere is maintained to prevent oxidation of the tin. The molten glass is allowed to spread under controlled conditions to establish a ribbon of predetermined width and thickness, and the ribbon is gradually cooled as it is pulled across the bath for removal as a continuous ribbon upon lift out rolls at the exit end of the bath. Thereafter the continuous ribbon is conveyed through an adjacent enclosed annealing lehr upon a series of aligned rolls for gradual cooling in accordance with a predetermined pattern for annealing purposes. The annealed ribbon or sheet is further cooled to ambient temperature while being conveyed on rolls in the ambient atmosphere, and then cut into individual sheets or blanks of desired dimensions. In order to utilize the residual heat from the ribbon forming process it is, of course, advantageous to deposit the desired coating layer or layers onto the surface of the glass substrate during its formation in the float glass process.

U.S. Pat. No. 4,019,887 to Kirkbride et al. discloses the coating of glass with a layer of silicon or a silica complex by continuous chemical treatment of a hot glass substrate with a non-oxidizing gas containing a monosilane. Inclusion of ethylene in the non-oxidizing gas of the Kirkbride et al. process to improve resistance of the silica complex layer to attack by alkali compounds is described in U.S. Pat. No. 4,188,444 to Landau.

As heretofore discussed, it is highly desirable to be able to apply various ones of the coatings, including the silica coating, within the float glass bath in conjunction with production of the glass ribbon. A reducing atmosphere is maintained within the float bath enclosure by the introduction of nitrogen and hydrogen in controlled proportions to prevent oxidation of the molten metal bath. Thus, care must be exercised if an oxidizing component is to be introduced into the float glass enclosure to minimize contamination of the reducing atmosphere. One prior art process for depositing silica coatings in the float bath has suggested as precursor gases a mixture consisting of silane ($SiH_4$), constituting the source of silicon, and an electron donor compound such as an ethylenic compound. As the sole source of oxygen capable of associating with the silicon atoms arising from the decomposition of the silane, this process relies upon a certain proportion of the oxygen atoms of the glass substrate diffusing to the surface. The diffusing may be enhanced by adsorption of the electron donor at the surface of the glass. The capacity for diffusing, however, is very limited and the resulting films are not of adequate thickness for many purposes.

U.S. Pat. No. 5,304,399 discloses a process using only a silane and an ethylene compound for obtaining a coating based upon silicon, oxygen and carbon and having a satisfactory thickness without utilizing a supplementary oxygen source. More particularly, it is suggested that by increasing the contact time between the precursor gases and the glass it is possible to amplify the diffusion of oxygen through the thickness of the glass, and by providing sufficient minimum proportions of silane and ethylene, to utilize this oxygen in forming a coating having the desired increased thickness. The necessary contact time is achieved through appropriate selection of the length of the deposition zone and the speed of the glass substrate as it moves through the zone. Due to the requirement for achieving the necessary contact time, such a procedure may not be readily adaptable for use with conventional coating equipment at float glass line speeds.

SUMMARY OF THE INVENTION

In accordance with the invention there is provided an improved method of pyrolytically forming a silica coating on a glass substrate at an elevated temperature. The method is particularly well suited to the forming of such a coating on a continuous float glass ribbon during its formation within a float glass bath enclosure in order to take advantage of factors such as the residual temperature and the pristine condition of the glass substrate. However, the method may be otherwise employed as in a lehr during annealing of a glass ribbon, or on individual sheets of glass reheated to the appropriate temperature.

Precursor materials comprising monosilane, a radical scavenger, oxygen and a carrier gas or gases are combined within a distributor beam device, and the mixture is directed toward and along the surface of the glass substrate passing therebeneath. The presence of the radical scavenger has been found to allow silane, which is pyrophoric, to be premixed with oxygen without undergoing premature ignition. Oxidation of monosilane apparently proceeds through the formation of radicals of intermediary species, and the presence of a compound acting as a radical scavenger prevents the reaction from occurring when the gas mixture is below a certain temperature threshold. Laboratory tests conducted with precursor lines and coater surfaces maintained at 250° F., and on-line tests with components similarly at 200° F., indicate premature burning does not occur. The presence of the radical scavenger presents a further advantage in that it contributes to the control of and permits optimization of the kinetics of the chemical vapor deposition (CVD) reaction on the glass. While the preferred combination of precursor materials includes monosilane ($SiH_4$), ethylene ($C_2H_4$) and oxygen, with ethylene functioning as the radical scavenger, it is contemplated that other and different materials may be employed in the combination as the radical scavenger.

BRIEF DESCRIPTION OF THE DRAWING

In the drawings, wherein like numerals refer to like parts throughout:

FIG. 1 is a schematic, longitudinal, vertical sectional view of an apparatus for practicing the float glass process and including gas distributor beams positioned for applying coating material in accordance with the invention;

FIG. 2 is a fragmentary sectional view of a coated glass article produced in accordance with the invention.

DESCRIPTION OF THE PREFERRED EMBODIMENT

Figure 3:
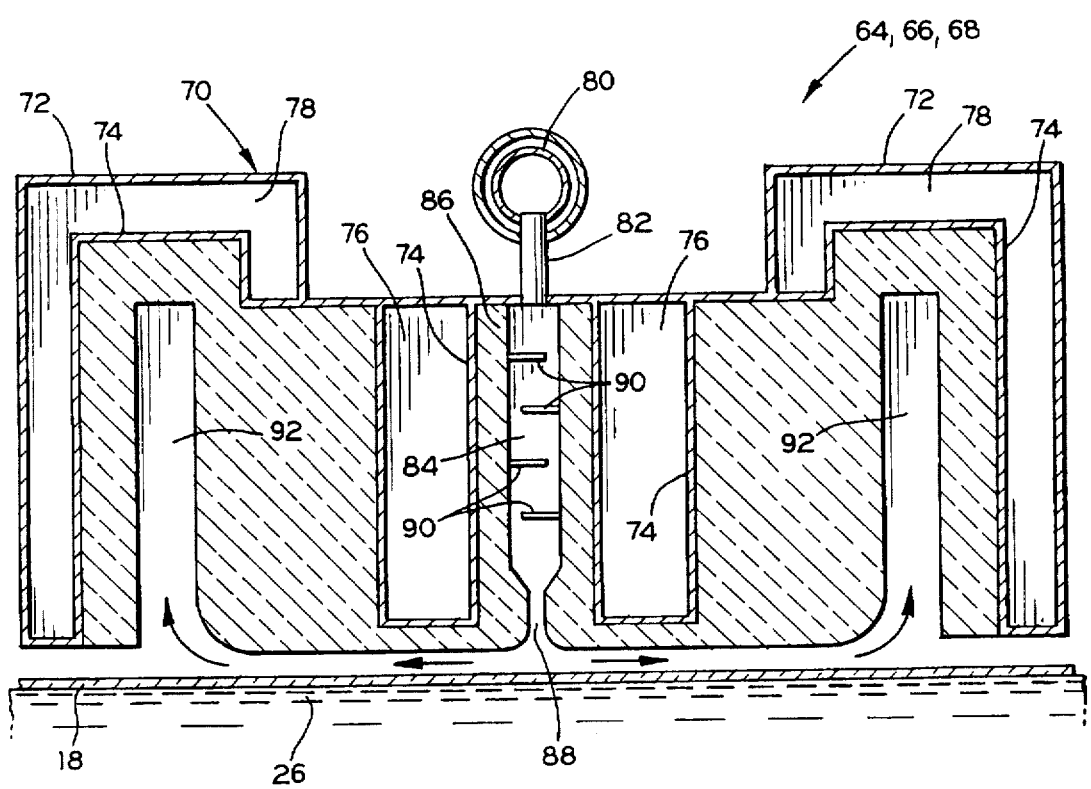
FIG. 3 is an enlarged schematic end view of a gas distributor beam suitable for use in practicing the invention.

Referring now to the drawings,there is illustrated generally at 10 in FIG. 1 a float glass facility embodying equipment for practicing the process of the present invention. The facility more particularly comprises a canal section 12 along which molten glass 14 is delivered from a melting furnace (not shown), to a float bath section 16 wherein a continuous glass ribbon 18 is formed in accordance with the well-known float process. The glass ribbon advances from the float section through an adjacent annealing lehr 20 and a cooling section 22. The float section 16 includes a bottom section 24 within which a bath 26 of molten tin is contained, a roof 28, opposite side walls 30, and end walls 32. The roof, side walls and end walls define an enclosure 34 over the tin bath 26 within which a non-oxidizing atmosphere is maintained to prevent oxidation of the molten tin.

In operation, the molten glass 14 flows along a canal 36 beneath a regulating tweel 38 and downwardly onto the surface of the tin bath 26 in controlled amounts. On the tin bath the molten glass spreads laterally under the influences of gravity and surface tension, as well as certain mechanical influences, and it is advanced across the bath to form the ribbon 18. The ribbon is removed over lift out rolls 40 and is thereafter conveyed through the annealing lehr 20 and the cooling section 22 on aligned rolls 42.

A suitable non-oxidizing atmosphere, generally nitrogen or a mixture of nitrogen and hydrogen in which nitrogen predominates, is maintained in the bath enclosure 34 to prevent oxidation of the tin bath. The atmosphere gas is admitted through conduits 44 operably coupled to a distribution manifold 46. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. Heat for maintaining the desired temperature regimen in the tin bath 26 and the enclosure 34 is provided by radiant heaters 48 within the enclosure. The atmosphere within the lehr 20 is typically atmospheric air, while the cooling section 22 is not enclosed and the glass ribbon is open to the ambient atmosphere. Ambient air may be directed against the glass ribbon as by fans 50 in the cooling section. Heaters (not shown) may also be provided within the annealing lehr for causing the temperature of the glass ribbon to be gradually reduced in accordance with a predetermined regimen as it is conveyed therethrough.

As heretofore indicated a glass article in accordance with the invention may include a coating comprising a single layer of a silica complex, or there may be provided a multilayered coating wherein the silica complex comprises any one or more of the layers. There is illustrated in FIG. 2 a glass article embodying the present invention, indicated generally at 52 and comprising a glass substrate 54 having a multilayered coating 56 deposited upon one surface thereof. By way of example the multilayered coating may comprise base, intermediate and top layers 58, 60 and 62, respectively, wherein the silica complex coating formed in accordance with the invention may comprise any of the layers. It is contemplated that the multilayered coating may comprise up to seven, or even more layers, wherein the coating is designed to achieve a particular optical effect. As disclosed in the prior art the various layers include, in various combinations, and in addition to others, coatings of silicon, metallic oxide, metallic nitride, metallic carbides, the silica complex, etc. Since formation of the silica coating does not utilize oxygen from the glass, the coating can be formed at any desired position in the multilayer stack.

In order to successively lay down the various coatings, a plurality of gas distributor beams may be conventionally provided within the float bath section 16 and/or within the annealing lehr 20. There is illustrated in FIG. 1 a typical system for laying down a three layer coating as illustrated in FIG. 2. More particularly, gas distributor beams shown generally at 64 and 66 extend transversely across the float bath section 16, and a gas distributor beam 68 extends transversely of the annealing lehr 20 over the glass ribbon 18 being conveyed therethrough. Additional distributor beams may be provided within both the float bath and the annealing lehr for application of additional layers as desired.

A conventional configuration for the distributor beams 64, 66 and 68 suitable for supplying the precursor materials in accordance with the invention is shown more or less schematically in FIG. 3. A framework 70 formed by spaced inner and outer walls 72 and 74, defines enclosed cavities 76 and 78 through which a suitable heat exchange medium is circulated for maintaining the distributor beam at a desired temperature. Precursor materials supplied through a fluid cooled supply conduit 80 extending along the distributor beam are admitted through drop lines 82 spaced along the supply conduit to a delivery chamber 84 within a header 86 carried by the framework 70. Precursor gases admitted through the drop lines 82 are discharged from the delivery chamber 84 through a passageway 88 toward and along the surface of the glass in the direction of the arrows in FIG. 3. Baffle plates 90 may be provided within the delivery chamber for equalizing the flow of precursor materials across the distributor beam to assure that the materials are discharged against the glass in a smooth, laminar, uniform flow entirely across the beam. Spent precursor materials, as well as a certain amount of the surrounding atmosphere around the beams, are collected and removed through exhaust chambers 92 along the sides of the distributor beam. Various types of suitable distributor devices for chemical vapor deposition are generally known in the prior art as disclosed, for example, in U.S. Pat. Nos. 4,504,526 and 5,065,696.

It has been found that by combining a suitable radical scavenger compound and oxygen in selectively controlled amounts with the silane-containing gas, not only can ignition of the precursor materials be prevented, but also the kinetics of the silica deposition reaction can be optimized. Examples of suitable radical scavenger compounds are selected hydrocarbons, and particularly propylene and ethylene. By using the radical scavenger in combination with silane and molecular oxygen, ignition of the potentially explosive mixture at the temperatures required for reaction can be prevented, and the rate of reaction can be controlled to spread the reaction over the entire coating area beneath the gas distributor beam. As a result, both the deposition rate and coating uniformity can be maximized. Silane conversion efficiency is also greatly increased, so that chemical consumption and powder generation are minimized, resulting in much longer run times between shutdowns for equipment cleaning.

Heretofore, in forming silica coatings for color suppression in coating structures on glass, it has been customary to employ, among others, a dichlorosilane/oxygen system or a silane/ethylene/acetone system. In order to achieve the low haze and low emissivity which is a prerequisite for the color suppression structure in coated glasses now under development, it is highly desirable to use chlorine-free precursors. The silane/radical scavenger/oxygen precursor of the present invention not only represents such a chlorine-free precursor, but also provides a silane conversion efficiency substantially higher than the dichlorosilane/oxygen precursor. The precursors of the present invention also provide a coating having better uniformity and a lower refractive index, are less sensitive to glass temperature, and have a much higher silane conversion efficiency than the silane/ethane/acetone system.

Examples of coating glass with a silica coating in accordance with the invention will be hereinafter described. It will be understood that the specific embodiments described are provided only for the purpose of illustration, and that the invention may be practiced otherwise than as specifically illustrated and described without departing from its spirit and scope.

A glass substrate to be coated with a silica coating, the substrate being of a conventional commercially available soda-lime-silica type, is produced in ribbon form on a bath of molten metal as with the apparatus of FIG. 1. The actual composition and thickness of the base or substrate glass do not structurally or chemically affect the composition of the coatings deposited thereon or the procedure for depositing them. The composition of the glass will, of course, affect the performance of the final product due to different absorption characteristics. It is contemplated that the invention may be practiced with different glasses of different compositions, including clear, blue, green, grey and bronze glasses.

The trials involved a three layer stack configuration as illustrated in FIG. 2. with the base and top layers 58 and 62 being conventionally-produced tin oxide layers. The three layer stack configuration was employed in order to facilitate measurement of the thickness of the silica coating 60, since measurement of silica alone on glass is time-consuming and lacks accuracy when the coating thickness is less than 500 Angstroms. The glass temperature in front of the gas distributor beam 64, by which the base layer 58 is deposited, was about 1290° F. (699° C).

Ethylene ($C_2H_4$) was employed as the radical scavenger gas, with monosilane ($SiH_4$) as the silicon-containing gas. It is contemplated that other hydrocarbons, particularly olefins, may serve as the radical scavenger compound so long as they inhibit premature ignition of the precursor materials, serve to control the kinetics of the CVD reaction on the glass, and do not produce byproducts which are detrimental to the float glass environment or structure. Ethylene has been found particularly well-suited in this regard. Although other gases containing silane may suitably be employed so long as they react to form the desired silica coating and no undesirable side effects are produced, monosilane is the presently preferred precursor material since it is readily available at reasonable cost.

Pure oxygen may be utilized as the precursor component. However, the components of atmospheric air are generally compatible with the environment of the distributor beam and the float bath atmosphere in the amounts required, and thus for purposes of economy air may be utilized as the source of oxygen. The inert carrier gas for the precursors is preferably nitrogen, or a mixture of nitrogen and helium in order to achieve a desired precursor gas density.

In the trials, the precursor gases comprised nitrogen and a proportion of helium as a carrier gas, and up to about 3.0% silane and 9.0% oxygen, by volume, with a radical scavenger gas in a ratio to silane of up to 17 to 1. The flow rate of the precursor gases to the distributor beam is up to about 215 standard liters per minute per meter of distributor beam length. It is contemplated that the flow rate may suitably be from about 70 to 215 standard liters per minute per meter of beam length, with a silane concentration by volume of about 0.05% to 3.0%. The oxygen concentration by volume may suitably be between about 0.15% and 9%, with a radical scavenger, preferably ethylene, to silane ratio between about 3 to 1 and 17 to 1. Preferably, the oxygen to silane ratio is about 3 to 1 and the ethylene to silane ratio is about 9 to 1.

The precursor gases were mixed and admitted through the supply conduit 80 and drop lines 82 to the delivery chamber 84 of the gas distributor beam 66. From the delivery chamber the gases were discharged through the passageway 88 for flow along the glass surface. A tin oxide layer was applied over the silica in the conventional manner at the third gas distributor beam 68 within the annealing lehr 20.

In a first series of tests, eighteen computer-designed experiments were run. The process variables and corresponding levels were derived from previous laboratory experimentation, and were chosen to cover the range of deposition rates required at a line speed of 550 inches (13.97 meters) per minute to produce a 250 Angstrom silica layer (which is suitable for color suppression). Process variables were run at the following levels:

| Flow Rate (Standard liters per minute per meter of beam length) | 116–138–159 |
| --- | --- |
| Silane Concentration | 0.8%–0.9%–1.0% |
| Ethylene/Silane Ratio | 3–6–9 |
| Oxygen Concentration | 3%–5%–7% |

For each set of test parameters, two transverse strips were cut from the glass ribbon at 5 minute intervals, and on each strip the properties were measured at three locations, left side, center and right side. Silica thickness, top tin oxide thickness, emissivity and haze were measured. The properties were determined at the three locations for each strip, and the properties reported are the averages of the six measurements.

In addition, the strips were visually inspected for uniformity and appearance rated according to the following schedule:

Poor: 0
Fair–: 1
Fair: 2
Fair+: 3
Good–: 4
Good: 5

The process varibles and results of the eighteen experiments are listed in Table I:

TABLE I

| Experiment No. | Silane Concentration (%) | Flow Rate (SLPM/per meter of length) | Ethylene/Silane Ratio | Oxygen Concentration (%) | $SiO_2$ Thickness (Å) | Emissivity | Haze | Top Tin Oxide Layer Thickness (Å) | Visual Appearance |
|---|---|---|---|---|---|---|---|---|---|
| 1 | 0.90 | 138 | 6.0 | 5 | 281 | 0.20 | 0.40 | 2294 | 0 |
| 2 | 1.00 | 138 | 6.0 | 5 | 324 | 0.19 | 0.40 | 2352 | 1 |
| 3 | 0.80 | 159 | 6.0 | 3 | 315 | 0.18 | 0.40 | 2416 | 5 |
| 4 | 1.00 | 159 | 9.0 | 7 | 453 | 0.19 | 0.40 | 2386 | 2 |
| 5 | 1.00 | 159 | 9.0 | 3 | 384 | 0.19 | 0.43 | 2387 | 5 |
| 6 | 1.00 | 116 | 9.0 | 3 | 321 | 0.19 | 0.43 | 2360 | 5 |
| 7 | 1.00 | 116 | 9.0 | 7 | 296 | 0.21 | 0.38 | 2235 | 3 |
| 8 | 0.90 | 116 | 6.0 | 7 | 227 | 0.24 | 0.35 | 2237 | 0 |
| 9 | 0.80 | 116 | 9.0 | 5 | 212 | 0.25 | 0.40 | 2205 | 0 |
| 10 | 0.90 | 138 | 9.0 | 3 | 309 | 0.19 | 0.47 | 2362 | 5 |
| 11 | 0.80 | 138 | 3.0 | 7 | 192 | 0.27 | 0.40 | 2211 | 0 |
| 12 | 0.80 | 159 | 9.0 | 7 | 297 | 0.20 | 0.43 | 2315 | 4 |
| 13 | 1.00 | 159 | 3.0 | 7 | 294 | 0.21 | 0.42 | 2269 | 3 |
| 14 | 1.00 | 159 | 3.0 | 3 | 294 | 0.20 | 0.43 | 2322 | 5 |
| 15 | 0.90 | 159 | 3.0 | 5 | 252 | 0.24 | 0.43 | 2237 | 0 |
| 16 | 1.00 | 116 | 3.0 | 3 | 249 | 0.21 | 0.42 | 2296 | 1 |
| 17 | 1.00 | 116 | 3.0 | 7 | 212 | 0.28 | 0.42 | 2236 | 0 |
| 18 | 0.90 | 138 | 6.0 | 5 | 287 | 0.22 | 0.40 | 2268 | 3 |

In a second series of tests, 22 additional experiments were run, with process variables at the following levels:

| | |
|---|---|
| Flow Rate (Standard liters per minute per meter of beam length) | 116–138–159 |
| Silane Concentration | 0.6%–0.7%–0.8% |
| Ethylene/Silane Ratio | 6–9–12 |
| Oxygen Concentration | 2%–4%–6% |

The process variables and results of the 22 experiments are listed in Table II:

It has been determined that an optimum thickness is achieved when the ethylene/silane ratio is equal to about 9 to 1. At lower ethylene levels the reaction is rapid so as to occur directly beneath the passageway 88 through which the precursor gases are discharged. Although the reaction occurs rapidly, a small portion of the coating area is utilized and maximum thickness of the silica layer is not achieved. At higher ethylene levels the reaction is slower, and thus extends toward the exhaust chambers 92 so that some of the precursor materials may be exhausted before reacting. The coating area is thus insufficiently utilized and the silica deposition rate drops. At intermediate levels of ethylene, reaction occurs over the entire coating area beneath the gas

TABLE II

| Experiment No. | Silane Concentration (%) | Flow Rate (SLPM/per meter of length) | Ethylene/Silane Ratio | Oxygen Concentration (%) | $SiO_2$ Thickness (Å) | Emissivity | Haze | Top Tin Oxide Layer Thickness (Å) | Visual Appearance |
|---|---|---|---|---|---|---|---|---|---|
| 19 | 0.70 | 138 | 9.0 | 4 | 187 | 0.27 | 0.50 | 2252 | 0 |
| 20 | 0.80 | 138 | 9.0 | 4 | 240 | 0.19 | 0.55 | 2412 | 0 |
| 21 | 0.60 | 159 | 9.0 | 2 | 204 | 0.18 | 0.58 | 2519 | 4 |
| 22 | 0.80 | 159 | 12.0 | 6 | 291 | 0.19 | 0.55 | 2460 | 2 |
| 23 | 0.80 | 159 | 12.0 | 2 | 274 | 0.18 | 0.53 | 2522 | 5 |
| 24 | 0.80 | 116 | 12.0 | 2 | 239 | 0.18 | 0.58 | 2516 | 4 |
| 25 | 0.80 | 116 | 12.0 | 6 | 222 | 0.23 | 0.58 | 2367 | 0 |
| 26 | 0.70 | 116 | 9.0 | 6 | 163 | 0.29 | 0.53 | 2263 | 2 |
| 27 | 0.60 | 116 | 12.0 | 4 | 158 | 0.30 | 0.53 | 2274 | 3 |
| 28 | 0.70 | 138 | 12.0 | 2 | 226 | 0.18 | 0.53 | 2503 | 4 |
| 29 | 0.60 | 138 | 6.0 | 6 | 165 | 0.29 | 0.55 | 2298 | 2 |
| 30 | 0.60 | 159 | 12.0 | 6 | 167 | 0.25 | 0.57 | 2340 | 0 |
| 31 | 0.80 | 159 | 6.0 | 6 | 257 | 0.21 | 0.57 | 2408 | 1 |
| 32 | 0.80 | 159 | 6.0 | 2 | 291 | 0.17 | 0.60 | 2538 | 5 |
| 33 | 0.70 | 159 | 6.0 | 4 | 218 | 0.23 | 0.50 | 2355 | 5 |
| 34 | 0.80 | 116 | 6.0 | 2 | 249 | 0.18 | 0.57 | 2518 | 5 |
| 35 | 0.80 | 116 | 6.0 | 6 | 212 | 0.25 | 0.57 | 2327 | 0 |
| 36 | 0.70 | 138 | 9.0 | 4 | 202 | 0.25 | 0.53 | 2326 | 1 |
| 37 | 0.90 | 138 | 9.0 | 3 | 282 | 0.17 | 0.63 | 2549 | 5 |
| 38 | 0.65 | 159 | 5.8 | 2 | 220 | 0.17 | 0.80 | 2535 | 4 |
| 39 | 0.69 | 159 | 5.5 | 2 | 243 | 0.17 | 0.63 | 2546 | 5 |
| 40 | 0.80 | 116 | 16.6 | 2 | 229 | 0.18 | 0.53 | 2497 | 3 | distribution beam so as to maximize the deposition rate and thus the thickness of the silica layer. For example, utilizing a precursor comprising 1.8% silane, 16.2% ethylene and 5.4% oxygen has been found to produce a silica-containing coating of about 600 Å at a line speed of 466 inches (11.8 meters) per minute.

The results of the experimental series also show that ethylene is necessary to achieve acceptable coating uniformity. At low ethylene levels, the silane/oxygen mixture is excessively reactive on the hot substrate, resulting in flow disturbances and coatings defects such streaks, blotches, etc. Ethylene not only prevents ignition of the precursor mixture, but also plays an important role in controlling the kinetics of the deposition reaction in the coating zone. This, in turn, contributes to optimizing both deposition rate and coating uniformity. Silica coating thickness is directly proportional to silane concentrations, provided that ethylene and oxygen concentrations are adjusted accordingly, so that thicker silica coatings than heretofore feasible can be obtained. Silane conversion efficiency approaches 30%, which is about 20% greater than the efficiencies achieved with the dichlorosilane/oxygen combination employed heretofore. Consequently deposits on the equipment are reduced and longer run time between shutdown for cleaning can be achieved, particularly at higher line speeds.

It is to be understood that the forms of the invention herewith shown and described are to be taken as illustrative embodiments only of the same, and that various changes in the shape, size and arrangement of parts, as well as various procedural changes, may be resorted to without departing from the spirit of the invention.

What is claimed is:

1. A process for depositing a silica coating upon a heated glass substrate comprising the steps of:
   a) providing the heated glass substrate having a surface upon which the coating is to be deposited;
   b) pre-mixing a silane, a radical scavenger gas, oxygen and an inert carrier gas to form a precursor mixture, directing the precursor mixture toward and along the surface to be coated in a laminar flow, and reacting the mixture at or near the surface to form the silica coating, the radical scavenger being present in an amount such that the radical scavenger to silane ratio is between 3 to 1 and 17 to 1; and
   c) cooling the coated glass substrate to ambient temperature.

2. A process for depositing a silica coating upon a glass substrate as claimed in claim 1, including:
   d) before step b) depositing onto the surface a coating of silicon, metallic oxide or metallic nitride.

3. A process for depositing a silica coating upon a glass substrate as claimed in claim 1, including:
   d) after step b) depositing onto the surface a coating of silicon, metallic oxide or metallic nitride.

4. A process for depositing a silica coating upon a glass substrate as claimed in claim 2, including:
   e) after step d) depositing onto the surface a coating of silicon, metallic oxide or metallic nitride.

5. A process for depositing a silica coating as claimed in claim 3, including:
   e) after step d) wherein a layer of silicon, metallic oxide or metallic nitride is deposited, the step of repeating step b) to deposit a second silica coating upon the layer of silicon, metallic oxide or metallic nitride.

6. A process for depositing a silica coating as claimed in claim 1, wherein the silane in the precursor mixture is monosilane ($SiH_4$).

7. A process for depositing a silica coating as claimed in claim 1, wherein the radical scavenger gas in the precursor mixture is selected from the group consisting of ethylene and propylene.

8. A process for depositing a silica coating as claimed in claim 7, wherein the radical scavenger gas is ethylene.

9. A process for depositing a silica coating as claimed in claim 1, wherein the silane is monosilane ($SiH_4$) and the radical scavenger is ethylene ($C_2H_4$).

10. A process for depositing a silica coating as claimed in claim 9, wherein the silane concentration in the precursor mixture is between about 0.05% and 3.0% by volume.

11. A process for depositing a silica coating as claimed in claim 9, wherein the oxygen concentration in the precursor mixture is between about 0.15% and 9% by volume.

12. A process for depositing a silica coating as claimed in claim 10, wherein the ethylene/silane ratio is between about 3 to 1 and 17 to 1 and the oxygen concentration is between about 0.15% and 9% by volume.

13. A process for depositing a silica coating as claimed in claim 12, in which the ethylene/silane ratio is about 9 to 1.

14. A method of producing a glass sheet substrate having a silica coating on one surface thereof comprising the steps of:
   a) maintaining the glass sheet substrate at a temperature of at least about 1050° F. (566° C.) in a non-oxidizing atmosphere;
   b) pre-mixing a silane, a radical scavenger gas, oxygen and an inert carrier gas to form a gaseous precursor mixture, directing the mixture toward and along said one surface in a laminar flow, and reacting the mixture at or near said one surface to form the silica coating, the radical scavenger being present in an amount such that the radical scavenger to silane ratio is between 3 to 1 and 17 to 1; and
   c) removing the coated glass substrate from the non-oxidizing atmosphere and cooling the coated substrate to ambient temperature.

15. A method of producing a glass sheet substrate having a silica coating on one surface thereof as claimed in claim 14, including the step after a) and prior to b) of depositing onto said one surface a coating selected from the group consisting of silicon, metallic oxides and metallic nitrides.

16. A method of producing a glass sheet substrate having a silica coating on one surface thereof as claimed in claim 14, including the step after b) of depositing onto said one surface a coating selected from the group consisting of silicon, metallic oxides and metallic nitrides.

17. A method of producing a glass sheet substrate having a silica coating on one surface thereof as claimed in claim 14, wherein said non-oxidizing atmosphere comprises a mixture of nitrogen and hydrogen in which nitrogen predominates, said silane comprises monosilane, said radical scavenger gas comprises ethylene, and said inert carrier gas comprises nitrogen.

18. A method of producing a glass sheet substrate having a silica coating on one surface thereof as claimed in claim 17, wherein the monosilane concentration is between about 0.05% and 3.0% of the precursor gas by volume, the oxygen concentration is between about 0.15% and 9% by volume of the precursor gas, and the ethylene/silane ratio is between about 3 to 1 and 17 to 1.

19. A method of producing a glass sheet substrate having a silica coating on one surface thereof as claimed in claim 18, wherein the monosilane concentration is between about 0.6% and 1.0% by volume, the oxygen concentration is between about 1.0% and 7% by volume, and the ethylene/silane ratio is between about 3 to 1 and 12 to 1.

20. A process for depositing a silica-containing coating upon a heated glass substrate comprising the steps of:

a) providing the heated glass substrate having a surface upon which the coating is to be deposited;

b) premixing a silane, a radical scavenger gas, oxygen and an inert carrier gas to form a precursor mixture;

c) maintaining the mixture at a temperature of at least 200° F., directing the mixture toward and along the surface to be coated in a laminar flow, and reacting the mixture at or near the surface to form the silica-containing coating, the radical scavenger being present in an amount such that the radical scavenger to silane ratio is between 3 to 1 and 17 to 1; and c) cooling the coated glass substrate to ambient temperature.

21. A method of producing a glass sheet substrate having a silica-containing coating on one surface thereof comprising the steps of:

a) maintaining the glass sheet substrate at a temperature of at least about 1050° F. (566° C.) in a non-oxidizing atmosphere;

b) premixing a silane, a radical scavenger gas, oxygen and an inert carrier gas to form a gaseous precursor mixture, directing said mixture toward and along said one surface and reacting the mixture at or near said one surface to form the silica-containing coating, the radical scavenger being present in an amount such that the radical scavenger to silane ratio is between 3 to 1 and 17 to 1; and c) removing the coated glass substrate from the non-oxidizing atmosphere and cooling the coated substrate to ambient temperature.

\* \* \* \* \*

UNITED STATES PATENT AND TRADEMARK OFFICE
CERTIFICATE OF CORRECTION

PATENT NO : 5,798,142
DATED : AUGUST 25, 1998
INVENTOR(S): MICHEL J. SOUBEYRAND

It is certified that error appears in the above-identified patent and that said Letters Patent is hereby corrected as shown below:

Column 2, Line 6 change "5,304,399" to --5,304,394--.

Column 6, Line 65 change "varibles" to --variables--.

Signed and Sealed this

Fourth Day of May, 1999

*Attest:*

Q. TODD DICKINSON

*Attesting Officer*     Acting Commissioner of Patents and Trademarks